United States Patent
Wang et al.

(10) Patent No.: US 9,870,940 B2
(45) Date of Patent: Jan. 16, 2018

(54) METHODS OF FORMING NANOSHEETS ON LATTICE MISMATCHED SUBSTRATES

(71) Applicant: Samsung Electronics Co., Ltd., Suwon-si, Gyeonggi-do (KR)

(72) Inventors: Wei-E Wang, Austin, TX (US); Mark Rodder, Dallas, TX (US); Borna Obradovic, Leander, TX (US)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 15/066,177

(22) Filed: Mar. 10, 2016

(65) Prior Publication Data
US 2017/0040209 A1 Feb. 9, 2017

Related U.S. Application Data

(60) Provisional application No. 62/200,330, filed on Aug. 3, 2015.

(51) Int. Cl.
*H01L 21/762* (2006.01)
*H01L 21/311* (2006.01)
(Continued)

(52) U.S. Cl.
CPC ...... *H01L 21/76251* (2013.01); *H01L 21/306* (2013.01); *H01L 21/31105* (2013.01);
(Continued)

(58) Field of Classification Search
CPC ......... H01L 21/76251; H01L 21/76254; H01L 21/187; H01L 21/84; H01L 27/1203; H01L 21/31105; H01L 21/3226
See application file for complete search history.

(56) References Cited

U.S. PATENT DOCUMENTS 6,448,152 B1 * 9/2002 Henley ............ H01L 21/76254
257/E21.568
6,953,736 B2 10/2005 Ghyselen et al.
(Continued)

OTHER PUBLICATIONS

Bai et al., "Ge/III-V Heterostructures and Their Applications in Fabricating Engineered Substrates," ECS Transactions, 33 (6) (2010) 927-932.
(Continued)

*Primary Examiner* — Eliseo Ramos Feliciano
*Assistant Examiner* — Joannie A Garcia
(74) *Attorney, Agent, or Firm* — Myers Bigel, P.A.

(57) ABSTRACT

Methods of forming nanosheets for a semiconductor device are provided including providing a silicon on insulator (SOI) handle wafer, the SOT handle wafer including a silicon layer and a dielectric layer on the silicon layer; providing a first donor wafer; bonding the SOI handle wafer and the first donor wafer together to provide a bonded structure; debonding the bonded structure to provide an intermediate wafer including a plurality of silicon or non-silicon nanosheets and a plurality of dielectric layers alternately stacked; and bonding the intermediate wafer to a second donor wafer to provide a final wafer including a plurality of silicon or non-silicon layers and a plurality of dielectric layers alternately stacked, wherein the final wafer includes at least one more pair of silicon or non-silicon and dielectric layers than the intermediate wafer.

20 Claims, 5 Drawing Sheets

(51) Int. Cl.
*H01L 21/322* (2006.01)
*H01L 21/306* (2006.01)

(52) U.S. Cl.
CPC .. *H01L 21/31116* (2013.01); *H01L 21/31122* (2013.01); *H01L 21/3226* (2013.01)

(56) References Cited

U.S. PATENT DOCUMENTS

| | | | |
|---|---|---|---|
| 7,002,175 B1 | 2/2006 | Singh et al. | |
| 7,232,737 B2 | 6/2007 | Daval | |
| 7,459,374 B2 | 12/2008 | Aulnette et al. | |
| 7,531,430 B2 | 5/2009 | Kononchuk | |
| 7,615,466 B2 | 11/2009 | Kononchuk | |
| 7,635,617 B2 | 12/2009 | Yamazaki | |
| 8,030,169 B2 | 10/2011 | Kakehata et al. | |
| 8,101,501 B2 | 1/2012 | Ohnuma et al. | |
| 9,023,705 B1 | 5/2015 | Paul et al. | |
| 9,064,789 B2 | 6/2015 | Cheng et al. | |
| 2006/0057836 A1* | 3/2006 | Nagarajan | H01L 21/76898 438/622 |
| 2006/0160328 A1* | 7/2006 | Daval | H01L 21/26506 438/455 |
| 2008/0093622 A1 | 4/2008 | Li et al. | |
| 2009/0117707 A1 | 5/2009 | Shimomura et al. | |
| 2011/0095291 A1 | 4/2011 | Quitoriano | |
| 2014/0097467 A1 | 4/2014 | Cheng et al. | |
| 2015/0364542 A1* | 12/2015 | Rodder | B82Y 10/00 257/29 |

OTHER PUBLICATIONS

Cheng et al. "High Performance Extremely Thin SOI (ETSOI) Hybrid CMOS with Si Channel NFET and Strained SiGe Channel PFET," IEEE (2012), IEDM12-419 to IEDM12-422.

Destefanis et al. "HCl Selective Etching of $Si_{1-x}Ge_x$ versus Si for Silicon on Nothing and Multi Gate Devices," ECS Transactions, 16 (10) (2008) 427-438.

Hjort, Klas, "Sacrificial etching of III-V compounds for micromechanical devices," J. Micromech.Microeng., 6 (1996) 370-375.

Köhler et al. "Vertical stress in liquid-phase epitaxy Si layers on $SiO_2$/Si evaluated by x-ray double-crystal topography," J. Phys. D: Appl. Phys., 28 (1995), A50-A55.

Loup et al., "Silicon and SiGe alloys wet etching using TMAH chemistry," Abstract #2101, $224^{th}$ECS Meeting (2013), 1 page.

Paul, Douglas J., "Si/SiGe heterostructures: from material and physics to devices and circuits," Semicond. Sci. Technol., 19 (2004) R75-R108.

* cited by examiner

METHODS OF FORMING NANOSHEETS ON LATTICE MISMATCHED SUBSTRATES

CROSS REFERENCE TO RELATED APPLICATION

The present application claims the benefit of and priority to U.S. Provisional Patent Application No. 62/200,330, filed Aug. 3, 2015, entitled Method of forming defect-free multi-horizontal nanosheet layers onto lattice mismatched substrates, the disclosure of which is hereby incorporated herein by reference as if set forth in its entirety.

FIELD

The present disclosure relates generally semiconductor devices and, more particular, to methods of forming semiconductor devices having nanosheets.

BACKGROUND

In the field of semiconductor devices, thin nanosheets are generally required for good electrostatic control for devices having short channel lengths. Variations of thickness in a nanosheet due to, for example, imperfect selective etching, can result in degradation of device performance and an inferior device. For example, portions of a nanosheet that are thicker than a desired thickness may contribute to a loss of electrostatic control and a resulting degradation of performance, such as higher required threshold voltage $V_t$ at a given off current $I_{off}$. Similarly, portions of the nanosheet that are thinner than a desired thickness may result in a lower effective value of the current ($I_{eff}$) than desired. Thus, uniform thickness of nanosheets is desirable.

Furthermore, if electrostatics is sufficient, it may be desirable for nanosheets to have widths as wide as possible, ideally spanning an entire available portion of the cell height. Introducing breaks in nanosheets in order to make the width of the individual stacks smaller and more amenable to processing, for example, undercut of sacrificial layers without affecting thickness of the conduction layers in the nanosheet field effect transistor (FET) stack, may result in increased contribution to parasitic capacitance. The space between the sheets adds a parasitic gate to drain capacitance $C_{gd}$ component, which may be detrimental to circuit performance. Thus, in addition to uniform, thin nanosheets, nanosheets as-wide-as-possible compatible with electrostatics, and precisely controlled are desired.

Conventional nanosheet fabrication includes epitaxial growth of the desired layers. For example, silicon germanium (SiGe) or silicon (Si) nanosheets are epitaxially formed yielding substantially defect-free Si/SiGe/Si/SiGe/Si . . . stacks, as long as the thickness of each layer is grown below a critical thickness hc. The critical thickness hc may vary from one device to another. Thus, the conventional stack of alternating Si and SiGe layers may provide defect-free stacks, but the critical thickness hc limitation put a ceiling of the maximum thickness of the nanosheets.

Furthermore, the selectivity ratio (SR) of Si versus SiGe, either from the wet etch using Tetramethylammonium hydroxide (TMAH) or a dry technique using hydrochloric acid (HCl), may be quite poor, for example, less than 5 and less than 30, respectively, due to the chemical similarity of silicon and germanium. This suggests that Si/SiGe/Si/SiGe . . . /Si stacks are unlikely to provide tight control of the shape of the nanosheets, thus, resulting in a deviation from the target performance and/or electrostatic control.

SUMMARY

Some embodiments of the inventive concepts provide methods of forming nanosheets for a semiconductor device. The methods include providing a silicon on insulator (SOI) handle wafer, the SOI handle wafer including a silicon layer and a dielectric layer on the silicon layer; providing a first donor wafer; bonding the SOI handle wafer and the first donor wafer together to provide a bonded structure; debonding the bonded structure to provide an intermediate wafer including a plurality of silicon or non-silicon nanosheets and a plurality of dielectric layers alternately stacked; and bonding the intermediate wafer to a second donor wafer to provide a final wafer including a plurality of silicon or non-silicon nanosheets and a plurality of dielectric layers alternately stacked, wherein the final wafer includes at least one more pair of silicon or non-silicon and dielectric layers than the intermediate wafer.

In further embodiments the method may further include providing a mask on a surface of the final wafer; and etching the final wafer according to the mask to provide vertical trenches therein.

In still further embodiments etching may be followed by removing the plurality of dielectric layers from between the plurality of silicon or non-silicon nanosheets.

In some embodiments, the dielectric layers may be oxide layers and removing may include removing the oxide layers using a hydrofluoric (HF) solution.

In further embodiments, the dielectric layers may include one of $SiO_2$, $Al_2O_3$ and $GeO_2$ layers.

In still further embodiments, the silicon or non-silicon nanosheets may include one of strained or unstrained silicon, strained or unstrained germanium, strained or unstrained silicon-germanium Group III elements, Group IV elements, Group V elements and combinations thereof.

In some embodiments, a thickness of the handle wafer including the silicon or non-silicon layer and the dielectric layer may be selected based on a desired thickness and spacing of a resulting nanosheet.

In further embodiments, the thickness of the silicon or non-silicon layer may be from about 3 nm to about 20 nm. The thickness of the dielectric layer may be from about 5 nm to about 20 nm.

In still further embodiments, the donor wafer may have a thermally oxidized top layer and a thickness of the thermally oxidized top layer may be from about 3 nm to about 20 nm. Hydrogen ions may be implanted into a surface of the donor wafer to a depth of from about 10 nm to about 50 nm.

In some embodiments, bonding the SOI handle wafer and the first donor wafer may be preceded by cleaning surfaces of the SOI handle wafer and the first donor wafer to remove surface contaminants thereon.

In further embodiments, the plurality of nanosheets may be substantially defect-free.

In still further embodiments, a crystal orientation of a strained layer of the plurality of nanosheets may be tuned, such as strained SOI.

In some embodiments, a crystal orientation of each layer of the plurality of nanosheets may be tuned.

In further embodiments, a thickness of the device may have no restrictions based on a critical thickness hc.

Still further embodiments of the present inventive concepts provide methods of forming nanosheets for a semiconductor device including providing a silicon on insulator (SOI) handle wafer, the SOI handle wafer including a silicon layer and an $SiO_2$ layer on the silicon layer; providing a first silicon donor wafer; bonding the SOI handle wafer and the first silicon donor wafer together to provide a bonded structure; debonding the bonded structure to provide an intermediate wafer including a plurality of silicon nanosheets and a plurality of $SiO_2$ layers alternately stacked; and bonding the intermediate wafer to a second silicon donor wafer to provide a final wafer including a plurality of silicon layers and a plurality of $SiO_2$ layers alternately stacked, wherein the final wafer includes at least one more pair of silicon and $SiO_2$ layers than the intermediate wafer.

Some embodiments of the present inventive concepts provide methods of forming nanosheets for a semiconductor device including providing a silicon on insulator (SOI) handle wafer, the SOI handle wafer including a non-silicon layer and a dielectric layer on the silicon layer; providing a first non-silicon donor wafer; bonding the SOI handle wafer and the first non-silicon donor wafer together to provide a bonded structure; debonding the bonded structure to provide an intermediate wafer including a plurality of non-silicon nanosheets and a plurality of dielectric layers alternately stacked; and bonding the intermediate wafer to a second non-silicon donor wafer to provide a final wafer including a plurality of non-silicon nanosheets and a plurality of dielectric layers alternately stacked, wherein the final wafer includes at least one more pair of non-silicon and dielectric layers than the intermediate wafer.

Other methods and devices according to embodiments of the present disclosure will be or become apparent to one with skill in the art upon review of the following drawings and detailed description. It is intended that all such additional methods and devices be included within this description, be within the scope of present inventive concepts, and be protected by the accompanying claims. Moreover, it is intended that all embodiments disclosed herein can be implemented separately or combined in any way and/or combination.

DETAILED DESCRIPTION OF EMBODIMENTS

Figure 1:
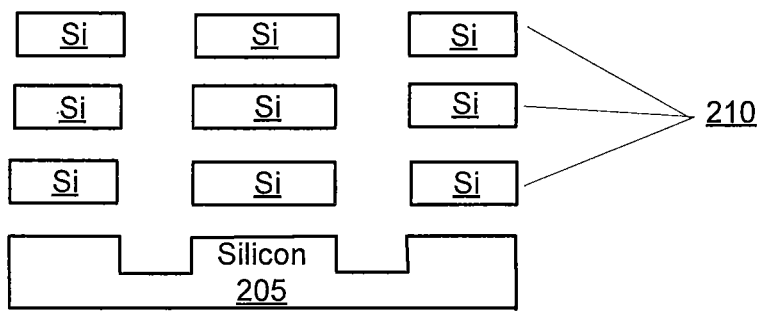
FIG. 1 is a cross section of a device including multiple silicon nanosheets in accordance with some embodiments of the present inventive concept.

Embodiments of the present inventive concepts now will be described more fully hereinafter with reference to the accompanying drawings. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

As is known to those of skill in the art, doped regions/layers may be formed through epitaxial growth and/or through implantation. For example, a layer may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions.

As discussed above, thin, wide and precisely controlled nanosheets are desired for optimal device performance. In other words, there are two key requirements for horizontal nanosheets from the materials and structural perspectives in meeting device performance of the advanced nodes utilizing this unique architecture. In other words, the shape of the nanosheet should be as close to rectangular as possible, to achieve low deviation from target performance and/or electrostatic control. Deviation from the rectangular shape, such as an oval shape, which results from a low selectivity etch, tends to degrade field effect transistor (FET) performance.

Conventional devices including silicon/silicon germanium (Si/SiGe) stacks formed by epitaxial growth may provide defect-free Si/SiGe stacks as long as a thickness of each layer is grown below a critical thickness hc, which puts a ceiling on a maximum thickness of the nanosheets.

As discussed above, the selectivity ratio (SR) of Si versus SiGe, either from the wet etch using Tetramethylammonium hydroxide (TMAH) or a dry technique using hydrochloric acid (HCl), may be quite poor, for example, less than 5 and less than 30, respectively, due to the chemical similarity of silicon and germanium. This suggests that Si/SiGe/Si/SiGe . . . /Si stacks are unlikely to provide tight control of the shape of the nanosheets, thus, resulting in a deviation from the target performance and/or electrostatic control. Thus, the conventional stacks may only be able to provide one of the two key factors in providing stable nanosheets.

Accordingly, embodiments of the present inventive concepts recognize that the SR of Si/silicon dioxide ($Si/SiO_2$) is one of the highest among all relevant nanosheets of interest, for example, greater than $1\times10^6$. However, an $Si/SiO_2$ stack cannot be grown epitaxially on an amorphous $SiO_2$ layer and vice versa. Thus, a stack of Si/SiO2/Si/SiO2/Si grown epitaxially may be able to provide tight control of the shape of the nanosheets due to the high SR, but may not be able to provide defect-free stacks.

Embodiments of the present inventive concepts address the provision of defect-free stacks by utilizing silicon-on-insulator (SOI) technology, which provide the defect-free stacks to satisfy one of the two key requirements. Accordingly, some embodiments of the present inventive concepts provide multiple nanosheets structures on silicon substrates that can be generated using SOI processes. The high etch selectivity of, for example, silicon against silicon dioxide (SiO2) is enabled to meet the stringent of nano sheet uniformity and thickness requirements. The thickness and spacing of each nanosheet can be independently tuned since each bonding step may be adjusted.

Although some embodiments discussed herein are directed to silicon nanosheets on silicon substrates, embodiments of the present inventive concepts are not limited to this configuration. For example, Group III, IV and V elements from the periodic chart may also be used without departing from the scope of the present inventive concept. Various combinations of materials have higher SR, for example $1 \times 10^4$-$1 \times 10^6$, than for Si/SiGe previously mentioned. For example, combinations of materials such as gallium Arsenide (GaAs) versus Aluminum Arsenide (AlAs); Indium GaAs (InGaAs) versus Indium Phosphorus (InP); Germanium versus GaAs. The highest SR is expected between the Group III-V and SiO2, or between these Group IV materials and SiO2. However, due to the high SR for the various combinations whether or not the sacrificial layer is SiO2, these materials, and/or combination of materials above, can be heterogeneously integrated according to some embodiments of the present inventive concept, which will be discussed further below with respect to FIGS. 1 through 4G.

As used herein when embodiments of the present inventive concepts involve Group III-V based devices, the term "Group III" refers to those semiconductor compounds formed with elements in Group III of the periodic table, usually aluminum (Al), gallium (Ga), and/or indium (In). Similarly, the terms "Group IV" and Group "V" refer to those semiconductor compounds formed with elements in Group IV (silicon (Si) and germanium (Ge)) and Group V (arsenic (As) and nitrogen (N)) of the periodic table. It will be understood that the term Group III-V may also refer to ternary compounds such as InGaAs without departing from the scope of the present inventive concept.

Referring now to FIG. 1, a cross-section of a device 200 having silicon nanosheets on a silicon substrate in accordance with some embodiments of the present inventive concepts will be discussed. As illustrated in FIG. 1, a three-layer silicon nanosheet 210 structure is provided on a Silicon substrate 205. Although the structure 210 of FIG. 1 includes a three-layer silicon nanosheet, embodiments of the present inventive concepts are not limited to this configuration. For example, the total number of nanosheets can be greater than or equal to two or more as long as the relevant bonding/debonding/planarizing steps meet final nanosheet requirements, which will be discussed further below.

As further illustrated in FIG. 1, the nanosheet's structure is a horizontal, periodic (parallel) structure. The thickness and spacing of each of the nanosheets may be tuned independently by the simple thermal oxidation of silicon. For example, a thickness of each nanosheet may be from about 3 to about 20 nm. Similarly, spacing between nanosheets may be from about 5 to about 20 nm. However, embodiments of the present inventive concepts are not limited to these examples. Unlike in a conventional Si/SiGe stack, it will be understood the thickness of each nanosheet in accordance with embodiments discussed herein can be thicker than the critical thickness hc of epitaxially grown nanosheets without generating any substantial defects.

Silicon nanosheets 210 fabricated in accordance with embodiments of the present inventive concepts discussed herein may be substantially 100 percent defect-free since they are from a substantially defect-free bulk silicon wafer without any alteration.

Each of the silicon nanosheets 210 can also be strained independently using demonstrated strained-SOI technology at the relevant forming steps by using the appropriate donor/handle wafers as will be discussed below.

The crystal orientation of each of the nanosheet layers 210 can be independently tuned by changing a starting wafer at that particular step since the oxidation (thermal oxidation of Si) and bonding force (van-der-Waal forces) are material-independent.

Figure 2:
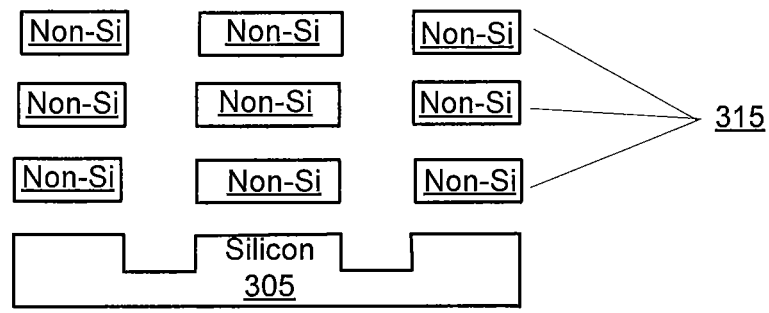
FIG. 2 is a cross section of a device including multiple non-silicon nanosheets in accordance with some embodiments of the present inventive concept.

Referring now to FIG. 2, a cross-section a device having non-silicon nanosheets on a silicon substrate in accordance with some embodiments of the present inventive concepts will be discussed. As illustrated in FIG. 2, the structure of the device 300 is similar to that of the device 200 of FIG. 1, but the nanosheets 315 provided on the silicon substrate 305 are non-silicon. For example, different channel materials can be integrated heterogeneously such as strained or unstrained Si, Ge, SiGe, InGaAs, GaAs, and the like by changing the starting wafers since the bonding force (van-der-Waal forces) is material-independent as will be discussed further below.

Similar to those discussed above with respect to FIG. 2, the nanosheets structure is a horizontal, periodic (parallel) structure. The thickness and spacing of each of the nanosheets may be tuned independently. For example, a thickness of each nanosheet may be from about 3 to about 20 nm. Similarly, spacing between nanosheets may be from about 5 to about 20 nm. However, embodiments of the present inventive concepts are not limited to these examples. Unlike in a conventional Si/SiGe stack, it will be understood the thickness of each nanosheets in accordance with embodiments discussed herein can be thicker than the critical thickness hc of epitaxially grown nanosheets layers without generating any substantial defects.

Processing steps in the fabrication of nanosheets in accordance with some embodiments of the present inventive concepts will be discussed below with respect to FIGS. 3 through 4G. Since embodiments of the present inventive concepts enable very rectangular or substantially rectangular nanosheets with a flat or substantially flat horizontal surface, the nano sheet field effect transistor (FET) in accordance with some embodiments of the present inventive concepts may be referred to as including horizontal multi-nanosheets (hmNS).

The methods of fabrication hmNSs in accordance with embodiments discussed herein can be applied to form nanosheets with various different materials since each layer can be obtained from different sources of OI, for example, SiGeOI, IIIVOI, and the like, and the corresponding bonding between layers may be carried out using the intermolecular material-independent physical attractions, i.e., van-der-Waal forces, without the need of chemical reactions between them at all.

Figure 3:
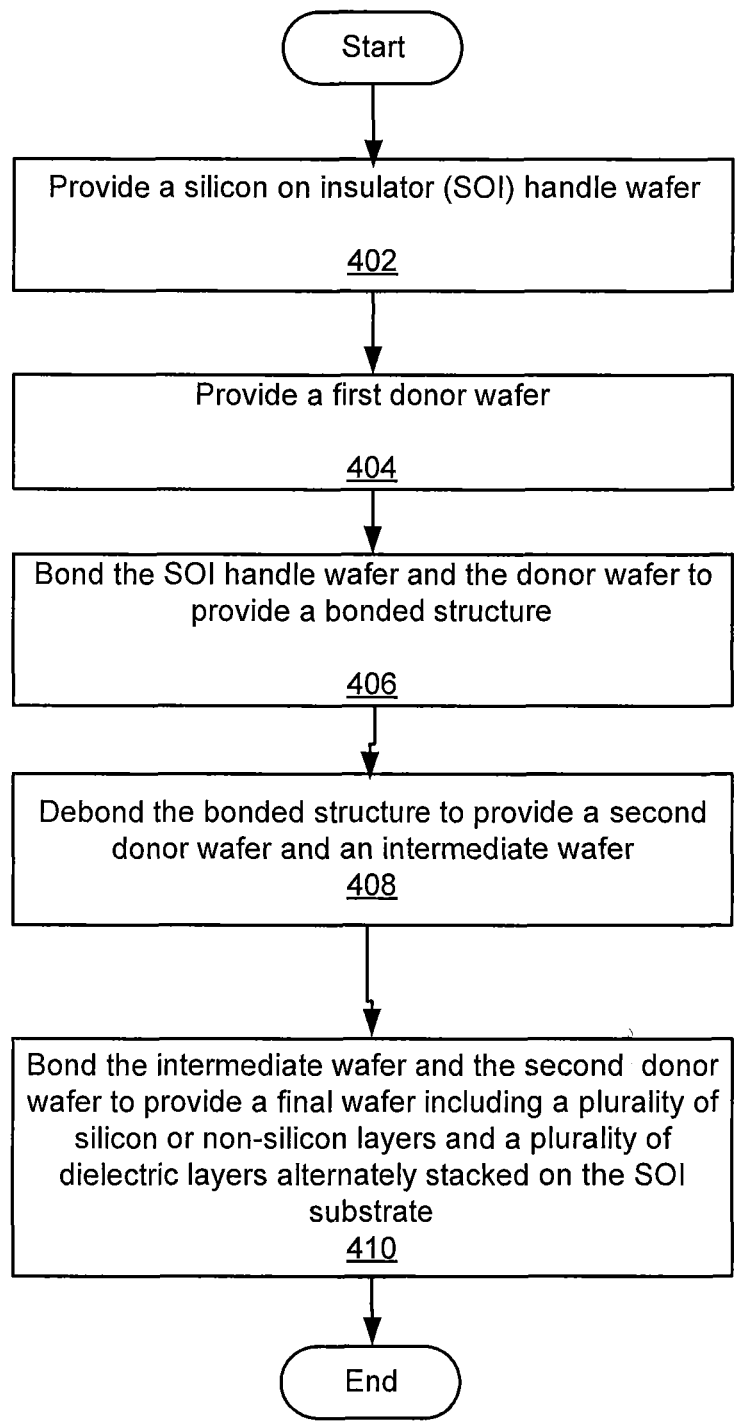
FIG. 3 is a flowchart illustrating operations in the fabrication of a device including multiple horizontal nanosheets in accordance with some embodiments of the present inventive concept.

Referring now to FIG. 3, a flowchart illustrating processing steps in the fabrication of 3-layer, for example, silicon nanosheets on regular wafers will be discussed. Operations begin at block 402 by providing a silicon on insulator (SOI) handle wafer. The handle wafer includes a silicon substrate with a dielectric, for example, a buried oxide (BOX) such as $SiO_2$, on the silicon substrate and a layer of silicon on the dielectric. The silicon layer and the dielectric (BOX) may have thicknesses simultaneously optimized to target values, for example, from about 3 nm to about 20 nm, of the nanosheet thickness and spacing.

Operations proceed to block 404 by providing a first donor wafer, for example, silicon. A surface or top layer of the first donor wafer may be thermally oxidized to the target values, for example, from about 5 nm to about 20 nm. In some embodiments, the first donor wafer may be implanted with, for example, hydrogen ($H_2$), to a depth deeper than the subsequent nanosheet requirements. For example, the implant may extend from about 10 to about 50 nm in the donor wafer. The depth may take into account the likelihood that some thickness of silicon will be lost due to a planarizing process, for example, a subsequent chemical mechanical polishing (CMP) process, used to smooth a surface of the wafer in a subsequent process.

The SOI handle wafer and the oxidized/implanted donor wafer are bonded together to provided a bonded structure (block 406). The surfaces of the SOI handle wafer and the donor wafer are typically cleaned before they are bonded to remove surface contaminants. The bonding process involves heating up the wafer in an inert gas, for example, $N_2$ or Ar, at an elevated temperature from about 300 to about 1000° C. for a period of time. For example, the time period could be from a few minutes to a few hours without departing from the scope of the present inventive concept.

The bonded structure undergoes a debonding process, for example, a medium temperature anneal from about 400° C. to about 1000° C. (block 408). The debonding process separates the donor wafer from the bonded structure to provide a second donor wafer. The remaining intermediate wafer and the second donor wafer may then undergo a planarizing process, for example, a CMP process. This CMP process may remove surface topology of these two wafers that were caused by the debonding process.

As discussed above, the donor wafer can be reclaimed as the second donor wafer and may be used as a new donor wafer as will be discussed below.

The intermediate wafer includes at least two silicon nanosheets and two dielectric layers, for example, buried oxide (BOX) layers, having a desired thickness. For example, in some embodiments, the silicon nanosheets have a thickness of from about 3 to about 20 nm and the BOX layers have a thickness of from about 5 to about 20 nm.

The reclaimed second donor wafer can be bonded together with the intermediate wafer to provide another layer of nanosheets (block 410). For example, in some embodiments, a three-layer Si nanosheet layer is provided as a final wafer. In some embodiments of the present inventive concept, the nanosheets may be strained. The final wafer can now be patterned and etched, for example, into the silicon substrate before removing BOX layers, for example, $SiO_2$ layers, with HF solutions, to form the desired NS FET structure as will be discussed further below with respect to FIGS. 4A through 4G. In some embodiments, the final wafer may be provided on bulk (OB) or on insulator (OI) depending on the designated etch step. Thus, the final wafer may be very flexible.

Thus, embodiments of the present inventive concepts provide an alternative method to create substantially defect-free, horizontal multiple nanosheets on silicon substrates, versus a conventional method based on epitaxial deposition of low SR conduction and sacrificial NS layers.

As discussed above, although embodiments discussed with respect to FIG. 3 are discussed with respect to SOI substrates and Silicon nanosheets, embodiments of the present inventive concepts are not limited to this configuration. For example, other channel materials, such as Ge, SiGe, and Group III through V elements may be used without departing from the scope of the present inventive concept.

Figure 4A:
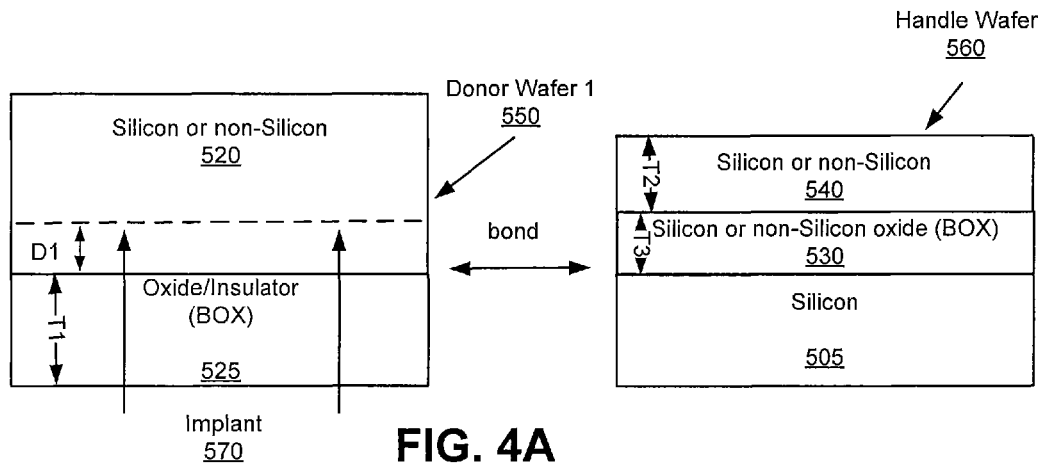
FIGS. 4A through 4G are cross sections illustrating operations in the fabrication of devices including multiple horizontal nanosheets in accordance with some embodiments of the present inventive concept.
Figure 4B:
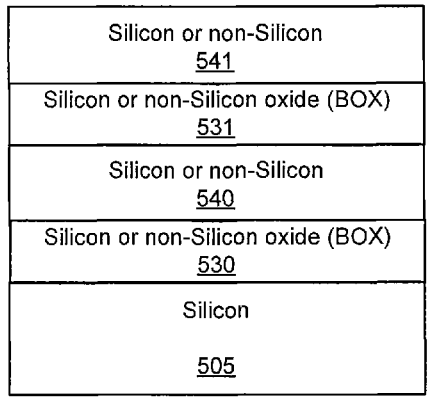
Figure 4C:
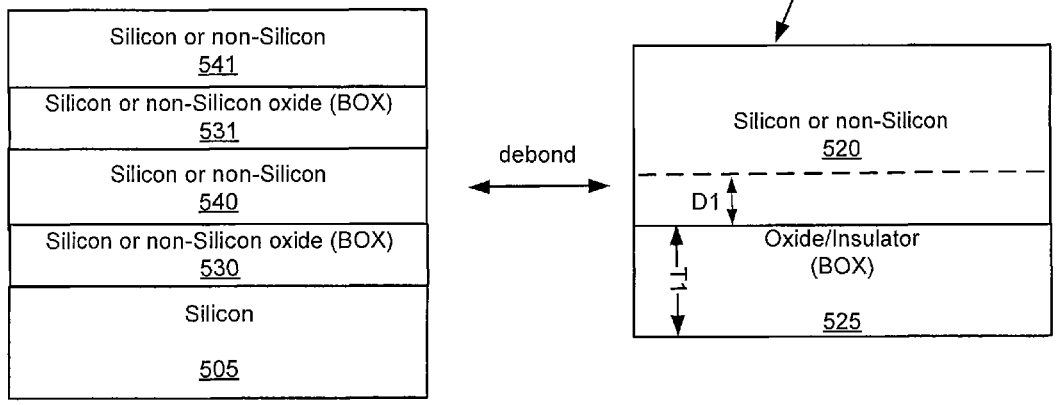
Figure 4D:
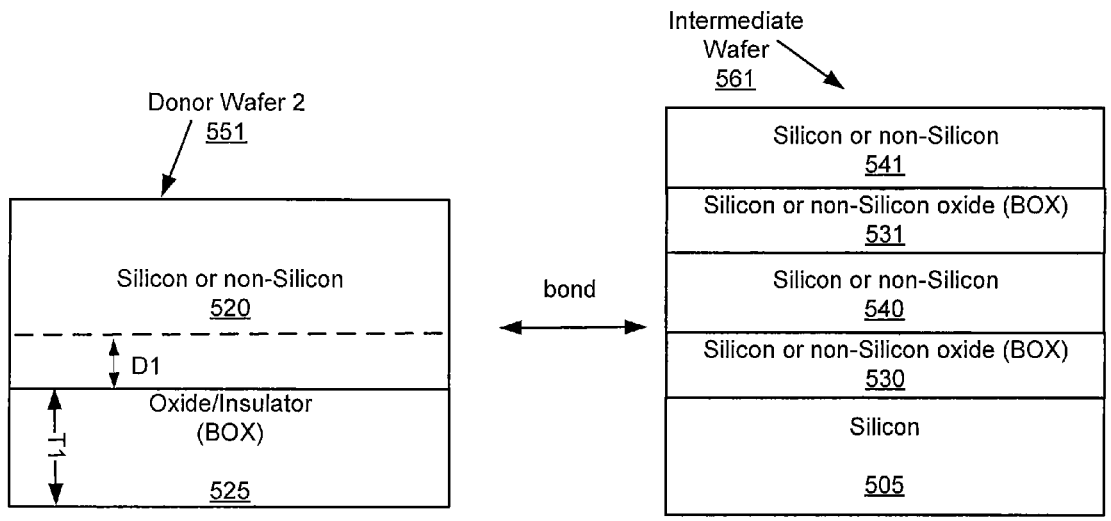
Figure 4E:
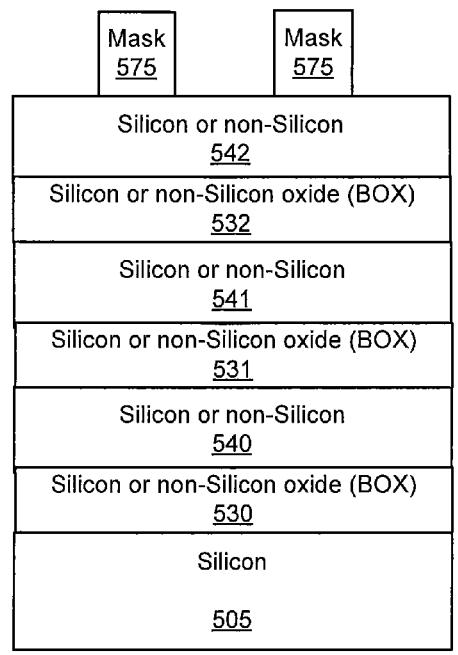
Figure 4F:
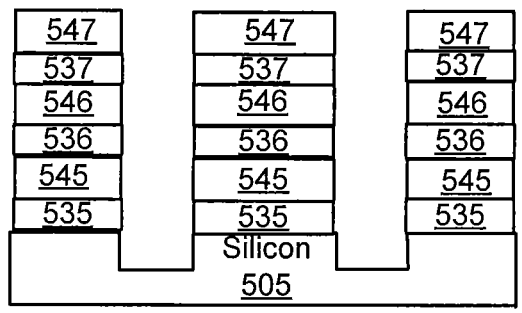
Figure 4G:
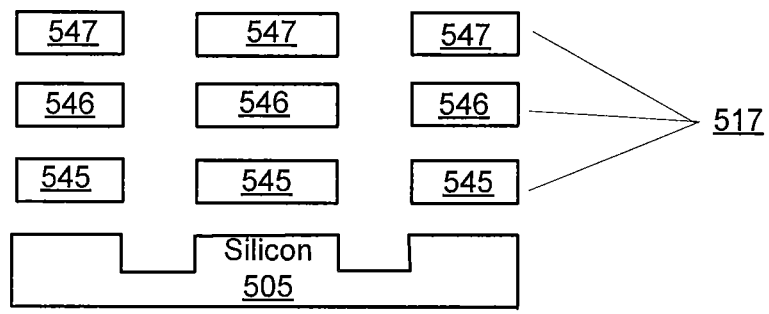

Referring now to FIGS. 4A through 4G, processing steps in the fabrication of nanosheets in accordance with some embodiments of the present inventive concepts will be discussed. Referring first to FIG. 4A, a first donor wafer 550 is provided. In some embodiments, the donor wafer is a silicon wafer 520 thermally-oxidized to form a dielectric layer 525, for example, an $SiO_2$ layer having a thickness T1 of from about 5 nm to about 20 nm. The donor wafer 550 may be further implanted with, for example, hydrogen ions 570, to a depth D1 ranging from about 10 nm to about 50 nm. The depth D1 of the implant is determined by nanosheet requirements and accommodating for future loss of thickness due to subsequent planarization processes.

In some embodiments, the donor wafer 550 is implanted with an implant typically used in the SOI technology, such as $_{H2}$ implant in SMARTCUT, with a depth deeper than the subsequent nanosheet requirements.

Although the embodiments of the present inventive concepts are discussed with respect to silicon donor wafers and $SiO_2$ BOX layers, embodiments of the present inventive concepts are not limited to this configuration. Different channel materials can also be integrated heterogeneously, such as strained or unstrained Si, Ge, SiGe, InGaAs, GaAs, and the like, by changing the starting wafers since the bonding force (van-der-Waal forces) is material-independent. Furthermore, the high etch selectivity of silicon against $SiO_2$ can be achieved by a typical industry standard wet HF-chemistry, which is known for selectively etching away $SiO_2$ without damaging silicon. However, other dielectrics, such as $GeO_2$ and $Al_2O_3$ and the like can also be used as long as the high SR is maintained. For convenience of discussion, the remaining processing steps discussed with respect to FIGS. 4A through 4G will be discussed with respect to Si donor wafers and $SiO_2$ BOX layers.

A handle wafer 560 is also provided. The handle wafer 560 is an optimized SOI wafer 505 with a silicon (or non-silicon as discussed above) layer 540 and dielectric 530 (BOX oxide $SiO_2$) thickness optimized in a way to meet the desired multi-nanosheets at the end. For example, the BOX layer 530 of the handle layer may have a thickness T3 from about 5 to about 20 nm. Similarly, the silicon or non-silicon layer 540 may have a thickness T2 of from about 3 to about 20 nm.

The surfaces of both the first donor wafer 550 and the handle wafer 560 are cleaned to remove contaminants thereon. As illustrated in FIG. 4A, the first donor wafer 550 and the handle wafer 560 are bonded together to as illustrated in FIG. 4B.

As further illustrated in FIG. 4B, the structure includes a silicon layer 505; a first silicon or non-silicon oxide 530; a first silicon or non-silicon layer 540; a second silicon or non-silicon oxide 531 and a second silicon or non-silicon layer 541. Thus, the oxide layers 530 and 531 may be the same or different. Similarly, the silicon or non-silicon layers 540 and 541 may be the same or different. As discussed herein, the layers can each be separately tuned without departing from the scope of the present inventive concept.

As illustrated in FIG. 4C, a debonding process is then performed on the structure of FIG. 4B to separate the donor wafer from the structure followed by additional process steps (BOX formation) to provide a second donor wafer 551 as illustrated in FIG. 4C. In some embodiments, the debonding process may be performed by a medium temperature anneal of from about 400° C. to about 1000° C.

It will be understood that the bonding and debonding steps according to embodiments of the present inventive concepts should be optimized in a way to protect the integrity of the channel materials. For example, the anneal for debonding of the implanted silicon wafer can be very high, for example, 500° C. to 1000° C. However, the debonding anneal of a Group III-V layer may need to be optimized to a lower temperature from about 300° C. to about 700° C. such that the integrity of the Group III-V materials is not compromised.

Referring again to FIG. 4C, an intermediate wafer 561 is provided including a plurality of silicon 540, 541 (or non-silicon) layers and a plurality of BOX layers 530, 531 alternately stacked. As discussed above, the layers 540 and 541 may be the same or different without departing from the scope of the present inventive concept. Similarly, the layers 530 and 531 may be the same or different. A planarizing process, for example, a CMP process, may be performed on both the intermediate wafer 561 and the second donor wafer 551 to remove surface topology resulting from the debonding process.

In some embodiments, the CMP process is optimized to ensure the uniformity of the multiple silicon channel layers meeting a final desired NS specification.

Referring now to FIG. 4D, the second donor wafer 551 (reclaimed donor wafer) and the intermediate wafer 561 can be bonded to provide a final wafer as illustrated in FIG. 4E. The final wafer illustrated in FIG. 4E is illustrated as having three silicon (or non-silicon) layers 540, 541 and 542 and three BOX layers 530, 531 and 532 on a silicon substrate 505. However, it will be understood that embodiments of the present inventive concepts are not limited to this configuration. The total number of nanosheets can be greater than two as long as the relevant bonding/debonding/CMP steps can meet the final NS requirements. Furthermore, as discussed above, the thickness of each nanosheet can be tuned not only independently to meet the final requirement of the NS, but may also be thicker than the critical thickness hc of conventional epitaxially grown nanosheets layers without generating any defect. It will be further understood that although embodiments of the present inventive concept are discussed herein as bonding the second donor wafer to the intermediate wafer, embodiments of the present inventive concept are not limited to this configuration. For example, any donor wafer could be bonded to the intermediate wafer without departing from the scope of the present inventive concept.

Referring again to FIG. 4E, a mask 575 may be formed on a surface of the final wafer and the final wafer may be etched according to the mask 575. In some embodiments, the mask 575 is provided by a corresponding device cell definition as required. In some embodiments, the vertical etch step can be tuned to create a uniform side wall of the trench and have the final nanosheets formed either on the bulk or on oxide depending upon the desired choice.

As illustrated in FIG. 4F, the final wafer may be etched according to the mask 575 into the silicon substrate 505 and provide a plurality of silicon or non-silicon layers 545, 546 and 547, which may or may not be the same and a plurality of BOX layers 535, 536 and 537, which may or may not be the same. The BOX layers 535, 536 and 537 may then be removed using, for example, an HF solution, to form the desired NS FET structure as illustrated in FIG. 4G.

Accordingly, as discussed above, the nanosheets structure created is a horizontal, periodic (parallel) structure with the thickness and spacing of each of the nanosheets tuned independently by the simple thermal oxidation of silicon. Silicon nanosheets created in this manner are naturally substantially 100 percent defect-free if they are from the defect-free bulk silicon wafer without any altercation.

In some embodiments, each of the silicon nanosheets can also be strained independently by using the demonstrated strained-SOI technology at the relevant forming steps by using the appropriate donor/handle wafers.

In some embodiments, the crystal orientation of each of the nanosheet layers can be independently tuned by changing the starting wafer at that particular step since the oxidation (thermal oxidation of Si) and bonding force (van-der-Waal forces) are material-independent.

As discussed above, although embodiments discussed herein primarily refer to silicon nanosheets, nanosheets composed of different channel materials can be integrated onto the same silicon wafer easily since each bonding is enabled by the intermolecular material-independent physical attractions of van-der-Waals forces. Thus, materials other than silicon, such as Ge or other Group III through V elements, can also benefit from the inventive concepts as long as the relevant OI process technology is available.

As further discussed above, various embodiments of the present inventive concepts can utilize various channel materials and/or various dielectric materials without departing from the scope of the present inventive concept. Some embodiments including various combinations of these materials will now be set out below. These are provided for example only and, therefore, embodiments of the present inventive concepts are not limited to the examples discussed herein.

Some embodiments utilize the high SR of Si/SiO$_2$ and the availability of SOI process technology to generate horizontal silicon nanosheets with the following features: (a) thickness-independent defect-free silicon layers; (b) very rectangular shape of silicon nanosheets due to the high SR; (c) no limits in the number of silicon nanosheets; and (d) formed on one of bulk silicon or OI substrates.

Some embodiments utilize simultaneously the high SR of Group IV/SiO$_2$ or Group III-V/oxide to generate horizontal non-Si nanosheets with the following features: (a) thickness-independent defect-free non-silicon layers; (b) very rectangular shape of non-silicon nanosheets due to a high SR; (c) no limits in the number of non-silicon nanosheets; and (d) formed on one of bulk or OI substrates. The oxide in these embodiments of the present inventive concepts is not a thermally grown oxide but a chemical vapor deposition (CVD) oxide. Other dielectrics, such as Al$_2$O$_3$ or GeO$_2$, may also be used as long as it can be etched in a high SR manner. For example, GeO$_2$ can be vaporized in vacuum at 420° C. without vaporizing Group III through Group V elements or Ge.

Some embodiments utilize simultaneously the high SR of Si/SiO$_2$, Group IV/SiO$_2$, or Group III-V/oxide to generate horizontal Si and non-Si nanosheets with the following features: (a) substantially thickness-independent defect-free Si and non-silicon layers; (b) very rectangular shape of Si and non-silicon nanosheets due to a high SR; (c) no limits in the number of Si and non-silicon nanosheets; (d) formed on one of bulk or OI substrates; and (e) Si or non-Si nanosheets in the stack each separated by a sacrificial layer including only SiO$_2$ or other dielectrics discussed herein.

Some embodiments utilize simultaneously the high SR of Si/SiO$_2$, GaAs/AlAs, InGaAs/InP, Ge/GaAs to generate horizontal Si and non-Si nanosheets with the following unique features: (a) substantially thickness-independent defect-free Si and non-silicon layers; (b) substantially rectangular shape of Si and non-silicon nanosheets due to a high SR or sufficiently high SR; (c) no limits in the number of Si and non-silicon nanosheets, (d) formed on one of bulk or OI substrates; and (e) Si or non-Si nanosheets in the stack each separated by a sacrificial layer that includes one of SiO$_2$ or non-SiO$_2$ including other dielectrics discussed above, AlAs, InP, or GaAs, depending on the conducting channel materials of the final NS FET.

Some embodiments utilize simultaneously the high SR of Si/SiO$_2$, GaAs/AlAs/SiO$_2$, InGaAs/InP/SiO$_2$, Ge/GaAs/SiO$_2$, and quantum well stack OI, such as AlAs/GaAs/AlAs/

$SiO_2$, $InP/InGaAs/InP/SiO_2$, $GaAs/Ge/GaAs/SiO_2$, $InGaAs/InAs/InGaAs/SiO_2$ to generate horizontal Si and non-Si multi-layer nanosheets with the following features: (a) substantially thickness-independent defect-free Si and non-silicon layers; (b) substantially rectangular shape of Si and non-silicon nanosheets due to a high SR or sufficiently high SR; (c) no limits in the number of Si and non-silicon nanosheets; (d) no limits in the combinational stack on top of the dielectric, such as GaAs/AlAs, InGaAs/InP, Ge/GaAs, popular quantum well such as AlAs/GaAs/AlAs, InP/InGaAs/InP, GaAs/Ge/GaAs, InGaAs/InAs/InGaAs, and the like; (e) formed on one of bulk or OI substrates; and (f) Si or non-Si nanosheets in the stack each separated by a sacrificial layer that includes SiO2 or non-SiO2 as discussed above, depending on the conducting channel materials of the final NS FET.

Some embodiments utilize simultaneously the high SR of strained-Si/$SiO_2$ (sSi/$SiO_2$, sSiGe/$SiO_2$) and Si/$SiO_2$, GaAs/AlAs/$SiO_2$, InGaAs/InP/$SiO_2$, Ge/GaAs/$SiO_2$, and quantum well stack OI, such as AlAs/GaAs/AlAs/$SiO_2$, InP/InGaAs/InP/$SiO_2$, GaAs/Ge/GaAs/$SiO_2$, InGaAs/InAs/InGaAs/$SiO_2$ to generate horizontal sSi and non-strained multi-layer nanosheets with the following features: (a) substantially thickness-independent defect-free and/or low-defectivity strained and non-strained layers; (b) substantially rectangular shape nanosheets due to a high SR or sufficiently high SR; (c) no limits in the number of nanosheets; (d) no limits in the combinational stack on top of the dielectric, such as GaAs/AlAs, InGaAs/InP, Ge/GaAs, quantum well such as AlAs/GaAs/AlAs, InP/InGaAs/InP, GaAs/Ge/GaAs, InGaAs/InAs/InGaAs, and the like; (e) formed on one of bulk or OI substrates; and (f) Si or non-Si nanosheets in the stack each separated by a sacrificial layer that includes SiO2 or non-$SiO_2$ as discussed above, depending on the conducting channel materials of the final NS FET.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments are described herein with reference to cross-section illustrations that are schematic illustrations of idealized embodiments (and intermediate structures). The thickness of layers and regions in the drawings may be exaggerated for clarity. Additionally, variations from the shapes of the illustrations as a result, for example, of manufacturing techniques and/or tolerances, are to be expected. Thus, embodiments illustrated herein should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Some embodiments are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

It is to be understood that the functions/acts noted in flowchart blocks may occur out of the order noted in the operational illustrations. For example, two blocks shown in succession may in fact be executed substantially concurrently or the blocks may sometimes be executed in the reverse order, depending upon the functionality/acts involved.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A method of forming nanosheets for a semiconductor device, the method comprising:
providing a silicon on insulator (SOI) handle wafer, the SOI handle wafer including a silicon layer and a dielectric layer on the silicon layer;
providing a first donor wafer;
bonding the SOI handle wafer and the first donor wafer together to provide a bonded structure;
debonding the bonded structure to provide an intermediate wafer including a plurality of silicon or non-silicon nanosheets and a plurality of dielectric layers alternately stacked; and
bonding the intermediate wafer to a second donor wafer to provide a final wafer including a plurality of silicon or non-silicon nanosheets and a plurality of dielectric layers alternately stacked, wherein the final wafer includes at least one more pair of silicon or non-silicon and dielectric layers than the intermediate wafer.

2. The method of claim 1, further comprising:
providing a mask on a surface of the final wafer; and
etching the final wafer according to the mask to provide vertical trenches therein.

3. The method of claim 2, wherein etching is followed by removing the plurality of dielectric layers from between the plurality of silicon or non-silicon nanosheets.

4. The method of claim 1, wherein the dielectric layers comprise oxide layers and wherein removing comprises removing the oxide layers using a hydrofluoric (HF) solution.

5. The method of claim 1, wherein the dielectric layers comprises one of $SiO_2$, $Al_2O_3$ and $GeO_2$ layers.

6. The method of claim 1, wherein the silicon or non-silicon nanosheets comprise one of strained or unstrained silicon, strained or unstrained germanium, strained or unstrained silicon-germanium, Group III elements, Group IV elements, Group V elements and combinations thereof.

7. The method of claim 1, wherein a thickness of the handle wafer including the silicon or non-silicon nanosheets and the dielectric layer is selected based on a desired thickness and spacing of a resulting nanosheet.

8. The method of claim 7:
wherein the thickness of the silicon or non-silicon nano sheet is from about 3 nm to about 20 nm; and
wherein the thickness of the dielectric layer is from about 5 nm to about 20 nm.

9. The method of claim 1:
wherein the donor wafer has a thermally oxidized top layer; and
wherein a thickness of the thermally oxidized top layer is from about 5 nm to about 20 nm.

10. The method of claim 1, further comprising implanting hydrogen ions into a surface of the donor wafer to a depth of from about 10 nm to about 50 nm.

11. The method of claim 1, wherein bonding the SOI handle wafer and the first donor wafer is preceded by cleaning surfaces of the SOI handle wafer and the first donor wafer to remove surface contaminants thereon.

12. The method of claim 1, wherein the plurality of nanosheets are substantially defect-free.

13. The method of claim 1, further comprising tuning a crystal orientation of each layer of the plurality of nanosheets.

14. The method of claim 1, further comprising one of tuning a strained layer of the plurality of nanosheets.

15. The method of claim 1, wherein a thickness of the device has no restrictions based on a critical thickness hc.

16. A method of forming nanosheets for a semiconductor device, the method comprising:
providing a silicon on insulator (SOI) handle wafer, the SOI handle wafer including a silicon layer and an $SiO_2$ layer on the silicon layer;
providing a first silicon donor wafer;
bonding the SOI handle wafer and the first silicon donor wafer together to provide a bonded structure;
debonding the bonded structure to provide an intermediate wafer including a plurality of silicon nanosheets and a plurality of $SiO_2$ layers alternately stacked; and
bonding the intermediate wafer to a second silicon donor wafer to provide a final wafer including a plurality of silicon nanosheets and a plurality of $SiO_2$ layers alternately stacked, wherein the final wafer includes at least one more pair of silicon and $SiO_2$ layers than the intermediate wafer.

17. The method of claim 16, wherein the plurality of silicon nanosheets are substantially defect-free.

18. The method of claim 16, further comprising:
providing a mask on a surface of the final wafer;
etching the final wafer according to the mask to provide vertical trenches therein; and
removing the plurality of $SiO_2$ layers from between the plurality of silicon nanosheets.

19. A method of forming nanosheets for a semiconductor device, the method comprising:
providing a silicon on insulator (SOI) handle wafer, the SOI handle wafer including a non-silicon layer and a dielectric layer on the silicon layer;
providing a first non-silicon donor wafer;
bonding the SOI handle wafer and the first non-silicon donor wafer together to provide a bonded structure;
debonding the bonded structure to provide an intermediate wafer including a plurality of non-silicon nanosheets and a plurality of dielectric layers alternately stacked; and
bonding the intermediate wafer to a second non-silicon donor wafer to provide a final wafer including a plurality of non-silicon nanosheets and a plurality of dielectric layers alternately stacked, wherein the final wafer includes at least one more pair of non-silicon and dielectric layers than the intermediate wafer.

20. The method of claim 19, wherein the plurality of nanosheets are substantially defect-free.

* * * * *